United States Patent
Krieger et al.

(10) Patent No.: US 6,606,724 B1
(45) Date of Patent: Aug. 12, 2003

(54) METHOD AND APPARATUS FOR DECODING OF A SERIALLY CONCATENATED BLOCK AND CONVOLUTIONAL CODE

(75) Inventors: Abraham Krieger, San Diego, CA (US); Donald Brian Eidson, San Diego, CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 09/492,962

(22) Filed: Jan. 28, 2000

(51) Int. Cl.[7] .................. H03M 13/00; H03M 13/03
(52) U.S. Cl. ............................ 714/755; 714/795
(58) Field of Search ........................ 714/755, 786, 714/794, 795

(56) References Cited

U.S. PATENT DOCUMENTS

| | | | | |
|---|---|---|---|---|
| 5,465,267 A | * | 11/1995 | Todoroki | 375/279 |
| 5,721,745 A | * | 2/1998 | Hladik et al. | 714/755 |
| 5,734,962 A | * | 3/1998 | Hladik et al. | 455/12.1 |
| 6,023,783 A | * | 2/2000 | Divsalar et al. | 714/792 |
| 6,118,825 A | * | 9/2000 | Ikeda et al. | 375/259 |
| 6,161,209 A | * | 12/2000 | Moher | 714/780 |
| 6,304,995 B1 | * | 10/2001 | Smith et al. | 714/786 |
| 6,351,832 B1 | * | 2/2002 | Wei | 714/701 |

OTHER PUBLICATIONS

Yong Li; Wai Ho Mow; Iterative decoding of serially concatenated convolutional codes over multipath intersymbol–interference channels; IEEE Internatioanl Conference on Communications, 1999, vol.: 2, Page(s): 947–951.*

Elbaz, A.; Ryndiah, R.; Solaiman, B.; Ait Sab, O.; Interative decoding of product codes with a priori information over a Gaussian channel for still image transmission: Global Telecommunications Conference, 1999; vol.: 5; Page(s): 2602–2606.*

Barbulescu, S. A., *Interative Decoding of Turbo Codes and Other Concatenated Codes*, Dissertation Submitted to the School of Electronic Engineering, University of South Australia, 1996, 9 pp.

Berrou et al., *Near Shannon Limit Error—Correcting Coding and Decoding: Turbo–Codes (1)*, Prog. ICC '93, Geneva, Switzerland, 1993, 7 pp.

Paaske, E., *Improved decoding for a Concatenated Coding System Recommended by CCSDS*; IEEE Transactions on Communications, vol. 38, No. 8, 1990, 7 pp.

Wicker et al., *Reed–Solomon Codes and Their Applications*, IEEE Communications Society and IEEE Information Theory Society, New York, 1994, 18 pp.

* cited by examiner

*Primary Examiner*—Albert Decady
*Assistant Examiner*—Joseph D. Torres
(74) *Attorney, Agent, or Firm*—Howrey Simon Arnold & White

(57) ABSTRACT

A decoder having a first decoder providing first decoded data. A deinterleaver is included for deinterleaving the first decoded data. A second decoder provides second decoded data based on the deinterleaved first decoded data. The second decoder provides at least one decode status signal indicative of second decoder operations. A pipeline decoder unit is included that is coupled to the second decoder. The pipeline decoder unit includes an encoder that receives the second decoded data and provides forced decision data, a multiplexer, and a third decoder that provides pipelined decoded data. The multiplexer is responsive to the at least one decode status signal to selectively constrain the pipelined decoded data to be at least partially dependent on the forced decision data.

31 Claims, 4 Drawing Sheets

METHOD AND APPARATUS FOR DECODING OF A SERIALLY CONCATENATED BLOCK AND CONVOLUTIONAL CODE

FIELD OF THE INVENTION

The present invention relates generally to communication systems; and, more particularly, to an improved method and apparatus for decoding serially concatenated block- and convolutional-coded data.

BACKGROUND OF THE INVENTION

Wireless communication systems are often limited in terms of transmitter power and spectrum availability. Broadband communication services often must fit within a limited if narrowband spectrum on an air interface network. Additionally, wireless transmission is significantly more error prone than broadband hard-wired networks. This tends to further reduce data capacity due to the necessity to transmit and process error control protocols.

For these and, other reasons, it is often a goal of digital communications design to maximize the transmission bit rate R and minimize the probability of bit error, or Bit Error Rate (BER) and system power S. The minimum bandwidth (BW) required to transmit at rate (R) is known to be Rs/2, where Rs is the symbol rate. A limit on the transmission rate, called the system capacity, is based on the channel BW and the signal to noise ratio (SNR). This limit theorem, also called the Shannon Noisy Channel Coding Theorem, states that every channel has a channel capacity C which is given by the formula, $C=BW \log_2 (1+SNR)$, and that for any rate R<C, there exist codes of rate $R_c$ which can have an arbitrarily small decoding BER.

For some time, the digital communications art has sought a coding/decoding algorithm which would reach the Shannon limit. Recently, coding/decoding schemes, called "Turbo Codes," have been determined to achieve fairly reliable data communication at an SNR which is very close to the Shannon Limit.

One form of turbo decoding operates upon serial concatenated codes. As an example, a serial concatenation of an outer, block code—such as a Reed Solomon code—and an inner, convolutional code, can be found in many communications and data storage applications requiring very low bit error rates. This type of serial concatenation is used, for example, in DBS (Direct Broadcast Satellite) standards.

One such serial concatenated system 100 is illustrated in FIG. 1. The serial concatenated system 100 includes a transmitter portion 102 for communicating encoded information to a receiver portion 104 via a communication channel 106. The transmitter portion 102 uses an outer code encoder or block encoder 108 (e.g., a Reed-Solomon encoder) to encode input bits. The output of the outer code encoder 108 is then provided to an interleaver 110 wherein the signal is shuffled in a predetermined manner. Next, the output of the interleaver is provided to an inner code encoder (e.g., convolutional encoder) 112. The output of the inner code encoder 112 is then modulated by modulator 114 and transmitted over the communication channel 106 to the receiver portion 104 for decoding and processing.

Once demodulated by demodulator 116, the classical approach for decoding a serial concatenated system 100 is to apply a soft-decision inner code decoder (e.g., Viterbi decoder) 118 that receives as inputs soft symbols and outputs hard bit estimates for the inner block code. The outputs of the inner code decoder 118 are then byte-deinterleaved by deinterleaver 120 and provided to an outer code decoder 122 (generally a block decoder such as a Reed-Solomon decoder) that can correct multiple byte errors in a block. If the outer code decoder 122 indicates that the number of errors is beyond its correction capability, it may indicate so and no corrections are made.

In effect, this classical approach to concatenated decoding decomposes the task into two independent procedures: one for the inner code, and another for the outer code. An "optimal" decoder is then selected and applied for each of these procedures. However, although each decoder may be optimal for its specific task, the overall composite system may not be optimal for a given concatenated code. This is because (1) the Reed-Solomon decoder uses hard—rather than soft-decision data, and (2) the Viterbi decoder performance could be improved in a second pass decoding operation. In particular, error bursts, which are observed in the first-pass decoding, could be broken up by using the bit decisions from blocks which were successfully decoded by a Reed-Solomon decoder. This operation would, in turn, impact a second-pass Reed-Solomon decoding of the data, perhaps enabling the Reed-Solomon decoder to correct another block that previously was considered uncorrectable. In principle, the sharing of outer-to-inner code decoding information could be re-iterated, resulting in even further improvements. In fact, this technique is similar to turbo decoding in a parallel or serial concatenated code context, with bit-by-bit maximum a posteriori probability (MAP) decoding.

Various iterative (turbo-like) decoding approaches have been used in simulation to decode serial concatenations of convolutional and Reed-Solomon codes. One problem in such decoding processes is determining how the Viterbi algorithm is to be modified to accommodate inputs from Reed-Solomon decoded blocks that are correct. No known technique has been developed for efficiently forcing a Viterbi encoder to constrain certain locations in a data record to desired output logic levels.

SUMMARY OF THE INVENTION

Briefly, the present invention uses a pipelined process to accelerate signal decoding and improve receiver performance in a serial concatenated coding environment. As compared with a conventional non-pipelined approach, the resulting coding gain is substantially greater with a decrease in BER. A system according to the present invention is particularly applicable to DBS communications and like applications.

In a disclosed embodiment of the present invention, demodulated serial concatenated data is provided to a first decoder (e.g., a convolutional or Trellis Coded Modulation (TCM) decoder). The decoder output is then deinterleaved and decoded by a second decoder (e.g., an algebraic and/or block decoder). In addition to providing decoded data, the outer decoder also provides at least one decode status signal indicative of the success of second decoder operations. Both the decoder data and decode status signals are provided as inputs to a pipeline decoder unit.

The pipeline decoder unit interleaves the data outputs of the second decoder, as well as the decode status signals. Interleaved data signals are then convolutionally encoded with the same type of convolutional encoder that was used to generate encoded data at the transmitter. The resulting binary "hard-decision" data may then be mapped into highly reliable soft-decision data. In one embodiment, for example, a logic level "0" may be mapped to a minimum-scale soft-decision value (e.g., 0000 with 4-bit quantization), and a logic level "1" mapped to a maximum-scale soft-decision value (e.g., 1111 with 4-bit quantization). In this embodiment, the output of the convolutional encoder 216 (FIG. 2) is not punctured regardless of whether the convolutionally encoded data at the transmitter was punctured. Instead, the "mapped" datastream is time-aligned with a buffered version of the original demodulated soft-symbol input sequence (with erasures inserted at punctured locations), and these datastreams are provided to the parallel inputs of multiplexing circuitry. The multiplexing circuitry is responsive to the interleaved decode status signals to selectively provide data to a third decoder.

In an exemplary embodiment of the invention, the third decoder is a Viterbi decoder configured to function in a similar manner to a MAP sequence decoder when provided with high-reliability hard-decision data from successfully decoded Reed-Solomon blocks. More particularly, when a "mapped" data element from a successfully decoded Reed-Solomon block is available, the multiplexing circuitry passes that data to the third decoder. When the incumbent "mapped" data element is from a failed Reed-Solomon block, then the multiplexer passes the buffered soft-decision input to the third decoder. Performing a second pass of Viterbi decoding results in a much smaller bit error rate than seen with a first Viterbi decoding pass, in that the third decoder benefits from the entire concatenated coding gain of the first decoding pass. Employing additional pipelined decoding units/operations provides even further improvements in bit error rates.

In an alternate embodiment of the invention, the third decoder is a Viterbi decoder having rescaled path metrics. In this embodiment, the interleaved data outputs of the second decoder are passed directly to the third decoder as forced a-priori values. The interleaved decode status signals are also provided to the third decoder to selectively constrain the output of the third decoder to be based on either the forced a-priori values or a delayed version of the demodulated serially concatenated code data.

A decoder according to the present invention thus provides improved decoding performance as compared to prior solutions, and is suitable for VLSI implementation and operation at relatively high data rates. In addition, with the disclosed pipelined approach, the processing speed of elements in the pipelined data path may be no different from those found in a classical concatenated decoder. Moreover, the present invention does not require a change to existing standards, and provides enhanced performance for communication systems that employ punctured encoding schemes.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
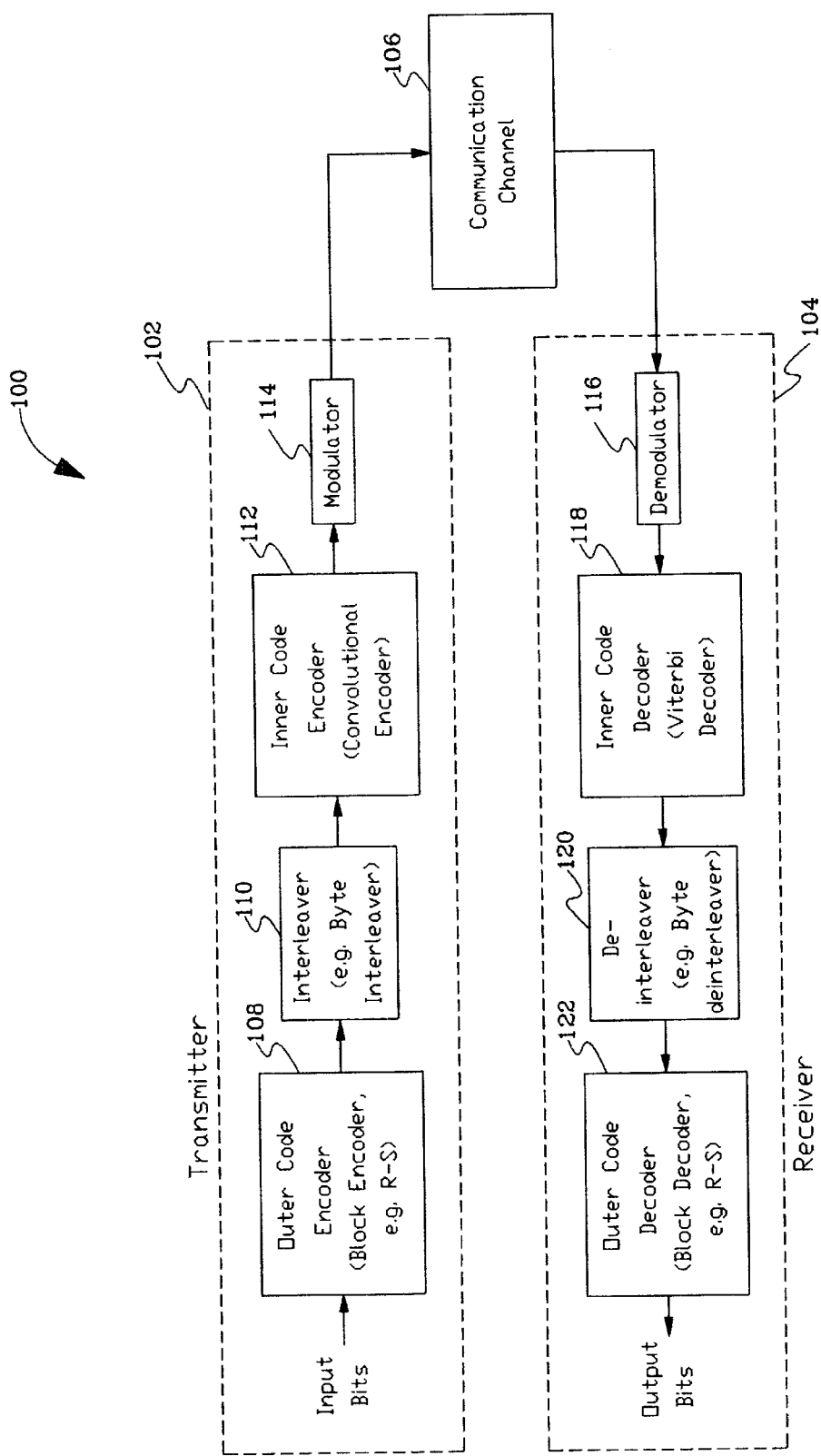
FIG. 1 is a schematic diagram of a conventional Serial Concatenated Coding system.
Figure 2:
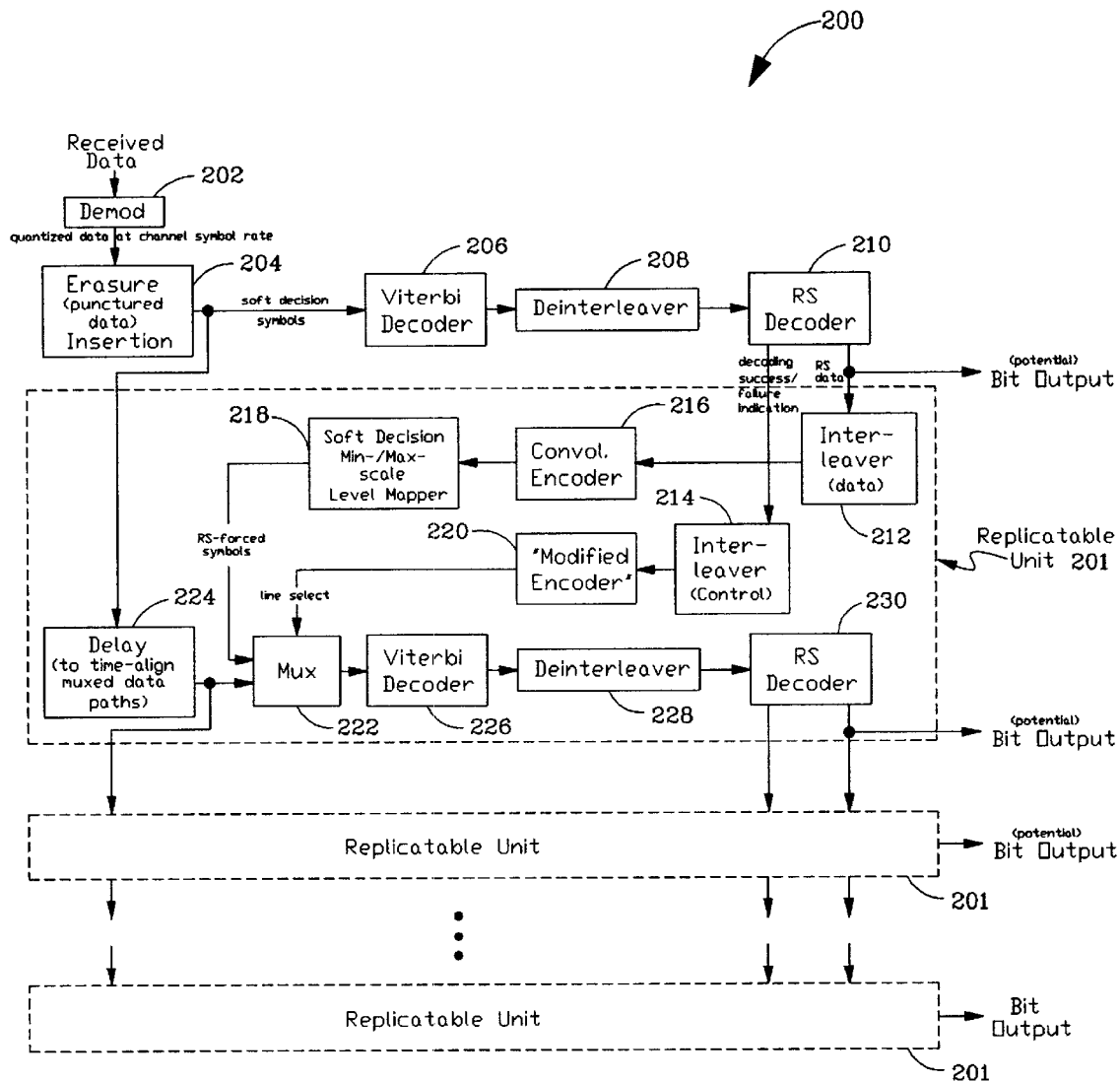
FIG. 2 is a schematic diagram of an exemplary communications system according to the present invention.

FIG. 2 is a schematic diagram of an exemplary communications system according to the present invention. The communications system includes a receiver 200 comprising at least one pipeline decoder unit 201. As will be appreciated, the pipeline decoder unit 201 includes decoding functionality that efficiently utilizes inputs from previously decoded blocks to improve receiver performance and coding gain.

One obstacle to direct VLSI implementations of iterative concatenated decoding is the required processing speed. For example, if serial data is input at 20 Msymbols/sec, and four iterations are desired, the Viterbi and Reed-Solomon decoders must operate at four times the symbol rate (80 Msymbols/sec)—if the streaming data is to be processed in real time. With the disclosed pipeline approach, however, the processing speed of elements in the pipelined datapaths does not need to be increased with respect to those found in a classical concatenated decoder.

Referring more particularly to FIG. 2, received data is first demodulated by a demodulator 202 to produce quantized data at the channel symbol rate. The quantized data/demodulated serial concatenated code data may then be provided to an erasure insertion circuit 204, in which an erasure is inserted, before the first decoding pass, at the point where the symbol was punctured by the transmitter. Puncturing coded outputs is acceptable for transmission purposes because of the redundancy of information which is created within typical encoders. As discussed in greater detail below, the pipeline decoder units 201 may be advantageously isolated from puncture-specific procedures.

The soft-decision symbols provided by the erasure insertion circuitry 204 are first decoded by an inner or first decoder 206 (e.g., a Viterbi or other convolutional decoder, or a TCM decoder), to produce first decoded data. The first decoded data is then deinterleaved by a deinterleaver 208 prior to provision to an outer or second decoder 210 (e.g., an algebraic and/or block decoder such as a Reed-Solomon decoder).

The Reed-Solomon decoder 210 has two outputs, which are provided to the first pipeline decoder unit 201: the actual bits of a decoded Reed-Solomon block, and a decode status signal output that indicates whether an associated Reed-Solomon block was decoded without error. The Reed-Solomon decoding status signal is replicated for each Reed-Solomon bit, forming a stream of status bits. In the disclosed embodiment, the Reed-Solomon data bits are provided to a data interleaver 212 of the first pipeline decoder unit 201, while the decode status bits are interleaved by a control interleaver 214. The data interleaver 212 and control interleaver 214 function to spread the status and data bits over multiple Reed-Solomon blocks of data. The data interleaver 212 preferably functions in a manner similar to the interleaver used by the transmitter to generate the serial concatenated data received by the receiver 200.

After interleaving, the Reed-Solomon data bits are re-encoded by convolutional encoder 216 to form encoded outputs. Again, the convolutional encoder 216 preferably functions in a like manner to the inner decoder used by the transmitter to produce the serial concatenated code data. As discussed more fully below in conjunction with FIG. 4, a similar encoding process is performed on the interleaved status bits by a "modified encoder" 220, such that a Viterbi or third decoder 226 can determine whether or not data bits produced by the convolutional encoder 216 evolved entirely from reliable Reed-Solomon-decoded blocks.

The Viterbi decoder 226 of the pipeline decoder unit 201 of the disclosed embodiment of the invention is configured to behave in a like manner to a MAP sequence decoder when provided with high-reliability data from successfully decoded Reed-Solomon blocks. In particular, the binary "hard-decision" data provided by the convolutional encoder 216 is provided to a soft-decision minimum-/maximum-scale level mapper 218, which functions to produce highly reliable soft-decision data. For example, a logic level "0" may be mapped to a minimum-scale soft-decision value (e.g., 0000 with 4-bit quantization), and a logic level "1" mapped to the maximum-scale soft-decision value (e.g., 1111 with 4-bit quantization). Next, the "mapped" datastream (or Reed-Solomon-forced decision symbol data) is time-aligned with the soft-decision symbol data produced by the erasure insertion circuitry 204. The temporal alignment is provided by delay circuitry 224. The time-aligned datastreams are then provided to the parallel inputs of multiplexing circuitry 222.

The multiplexing circuitry 222 receives the output of the modified encoder 220 as a control signal to selectively determine which of the datastreams to provide to the third decoder 226. When Reed-Solomon forced-decision symbol data is available from a successfully decoded Reed-Solomon block, the multiplexing circuitry 222 passes that data to the third decoder 226. When the incumbent "mapped" element is from a failed Reed-Solomon block, the multiplexing circuitry instead passes the delayed soft-decision symbol data from block 224 to the third decoder 226. The third decoder 226 decodes the output of the multiplexing circuitry 222 to provide "pipelined" decoded data characterized by having a smaller bit error rate than the decoded data provided by the first decoder 206. In particular, the third decoder 226 benefits from the entire concatenated coding gain of the first decoding pass.

The output of the third decoder 226 is next deinterleaved by deinterleaver 228, whose output is provided to a fourth/Reed-Solomon decoder 230. As with the Reed-Solomon decoder 210, the Reed-Solomon decoder 230 of the pipeline decoder unit 201 may include both a decoded data datastream, as well as a decode status signal datastream. These datastreams, as well as the output of the delay circuitry 224, may be provided to an additional pipeline decoder unit 201.

It is contemplated that any number of additional pipeline decoder units 201 may be similarly utilized until the desired coding gains and BER is achieved. In another contemplated embodiment of the invention, the clock rate for the decoder 200 could be increased and additional multiplexing circuitry provided such that the first decoder 206 could be leveraged to perform the function of the third decoder 226. Similarly, the second decoder 210 could be reused to perform the function of the fourth decoder 230. By using an appropriate clocking scheme, additional "pipelined" iterations could be performed by the first decoder 206 and the second decoder 210. In this manner, the hardware overhead associated with the disclosed received 200 may be reduced.

Although the illustrated receiver 200 makes use of a convolutional inner code and an algebraic or Reed-Solomon outer code, it is contemplated that a decoder according to the present invention may be adapted to utilize TCM codes and/or other types of block codes.

Figure 3:
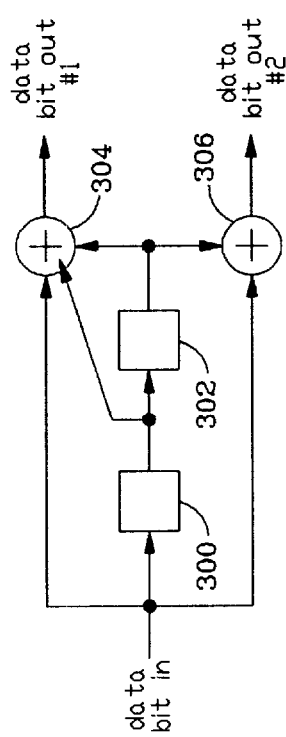
FIG. 3 provides exemplary details of a convolutional encoder for encoding data in the communication system of FIG. 2.

FIG. 3 provides exemplary details of a convolutional encoder 216 for encoding data in the communication system of FIG. 2. The convolutional encoder 216 receives a continuous sequence of data input bits that are mapped into a continuous sequence of encoder data bit outputs. The convolutional encoder 216 comprises a finite state shift register formed of series-connected flip-flops 300 and 302. In accordance with conventional encoder architectures, the data inputs bits, as well as the outputs of each of the flip-flops 300 and 302 are provided to a first exclusive OR (XOR) gate 304. The XOR gate 304 produces a first data bit output. The data bit inputs are likewise provided to a second XOR gate 306, which also receives the output of the flip-flop 302. The second exclusive OR gate 306 produces a second data output bit. As will be appreciated, the first and second outputs of the convolutional encoder 216 relate to a rate ½ code, and may be converted from a parallel format to a serial format via a converter (not shown).

Figure 4:
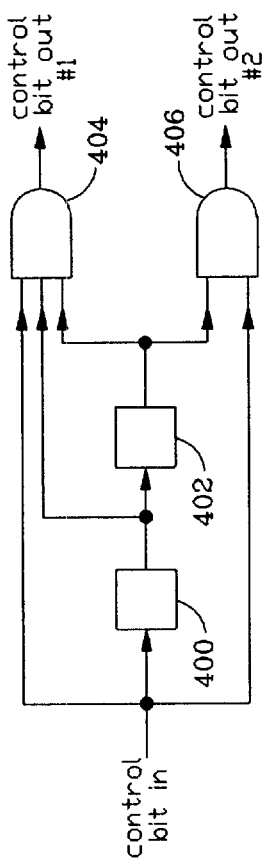
FIG. 4 provides exemplary details of a modified encoder for encoding data status information for use by the communication system of FIG. 2.

FIG. 4 provides exemplary details of a modified encoder 220 for encoding decode status signals generated by an outer decoder 210. The modified encoder 220 structurally resembles the convolutional encoder 216, with the exception that the XOR gates 304 and 306 in the convolutional encoder 216 are replaced by AND gates 404 and 406. The incoming decode status signal/control bits, as well as the outputs of flip-flops 400 and 402 are provided to the three input AND gate 404, which produces a first control bit. The decode status signals and the output of the flip-flop 402 are provided to the two input AND gate 406, which produces a second control bit. This arrangement is advantageous because when the output of the convolutional encoder 216 has no dependency on input data that is invalid, the modified encoder 220 signals that the output is valid. This is true even if the code in question may have shift register entries which are invalid but not accessed, as is the case for the control bit produced by AND gate 406. As previously discussed, the outputs of the modified encoder 220 may be used to control the multiplexing circuitry 222, which determines whether the re-encoded data is used.

As illustrated in the disclosed embodiment of the invention, the symbols erased by puncturing (at the transmitter) are inserted before the first decoding pass. Thus, decoding operations performed by the pipeline decoder unit(s) 201 need not perform puncture-specific procedures. Instead, the pipelined decoder unit(s) 201 can be configured to operate as fixed-rate devices (with the possible exception that the trace back length in the Viterbi decoder(s) 216 may be lengthened for optimal decoding performance when punctured data is present). It is also noted that in secondary decoding passes, the erased data that was re-inserted does not necessarily remain indeterminate (i.e., somewhere between a logic level "1" and "0") as it was when initially inserted. If the re-inserted data arises from a bit that was correctly decoded in a Reed-Solomon block evaluation, then its value is known with very high probability. Thus, it is possible to correctly infer the value of untransmitted punctured bits and use this information in all subsequent decoding passes. This enhances the performance of the receiver 200 in high data rate applications involving puncturing.

In the disclosed embodiment of the invention, the Viterbi or third decoder 226 of the pipeline decoder unit 201 is described as utilizing forced decision data, which forces the third decoder 226 to behave much like a MAP sequence processor. Although not precisely a MAP solution, the approximation is such that there is no discernible difference in the disclosed implementation. The actual MAP solution is to not allow any transition from trellis states which would result in a Viterbi decoder outputting a result which is contrary to what a Reed-Solomon decoder has indicated as the desired output. In one contemplated alternate embodiment, if the number of memory elements in a code is m (resulting in $2^m$ states), and it is desired to force a logic level "0" at the output of the third decoder 226 for a given node, then the top $2^{m-1}$ states are not altered, while the bottom $2^{m-1}$ states are set to the most unfavorable path metric. In this manner, the next state at the output of the third decoder 226 will be a logic level "0". Similarly, to force a logic level "1", the top $2^{-1}$ states are set to the most unfavorable path metric. This procedure describes the decoding of rate 1/n non-systematic convolutional codes. As will be appreciated, in this embodiment it is not necessary to reinsert erasures into punctured data positions. Analogous techniques (e.g., a look-up table) using the same concept of path re-normalization can be devised for other codes without departing from the spirit of the invention.

In one contemplated embodiment of the invention, the described approximation functions in part because of an implementation of a four-bit soft-decision Viterbi or third decoder 226 requiring only five-bit path metrics for minimal implementation loss. For a rate ½ code, two 4-bit symbols are used to form a branch metric, and these in turn are added to a previous path metric to form an updated path metric. The two maximum-scale four-bit inputs (which are forced using the disclosed mapping approach) add up to five bits, and this in turn is added to a previous path metric. So long as the path metric registers saturate, encoder "forcing" is equivalent to forcing the, unfavored path metrics to extreme five-bit worse case values, ala a MAP processor.

Figure 5:
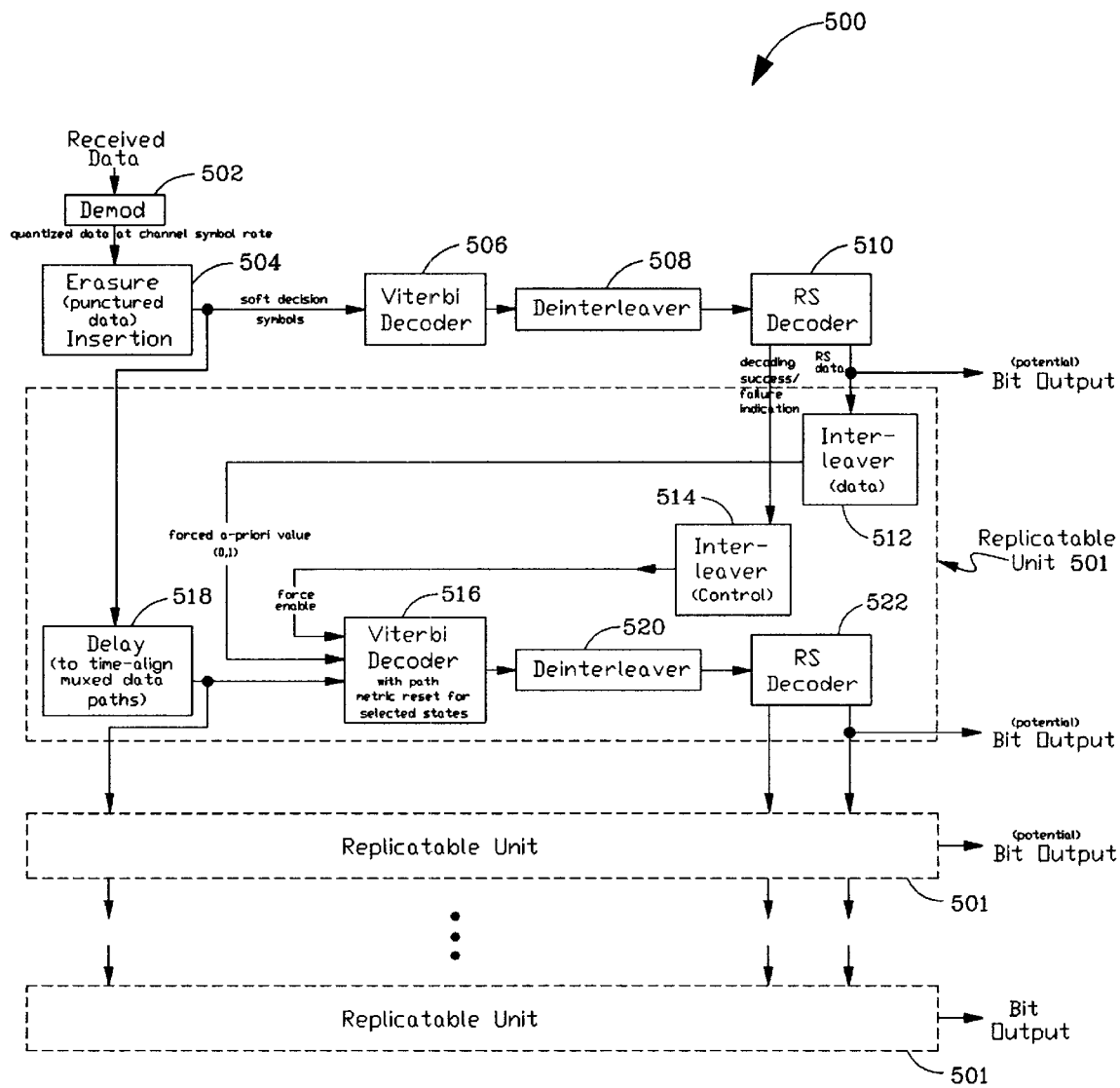
FIG. 5 is a schematic diagram of an alternate embodiment of a pipelined communications system according to the present invention.

FIG. 5 is a schematic diagram of an alternate embodiment of a pipeline communication system according to the present invention. In this embodiment of the invention, a receiver 500 includes demodulation and decoding elements 502–510 functioning in a like manner to demodulation and decoding elements 202–210 of FIG. 2. The receiver 500 also includes at least one pipeline decoder unit 501 employing a data interleaver 512 and a control interleaver 514 (functioning in a like manner to data interleaver 212 and control interleaver 214 described above).

In this embodiment of the invention, the outputs of the data interleaver 512 are provided directly to a Viterbi decoder 516 as forced a-priori values. The Viterbi decoder 516 includes rescaled path metrics for utilizing the forced a-priori values. The decode status signals provided by the control interleaver 214 are also passed directly to the Viterbi decoder 516 to selectively constrain the output of the Viterbi decoder 516 to be based on either the forced a-priori values or a delayed version of the demodulated serially concatenated code data provided by delay circuitry 518. The output of the Viterbi decoder 516 is provided to a deinterleaver 520 and second outer decoder 522 operating in an analogous manner to deinterleaver 228 and fourth decoder 230 of FIG. 2.

Thus, a communication system has been described for accelerating signal decoding and increasing receiver performance in a serial concatenated coding environment. The communication system utilizes a pipelined architecture to provide recognizable increases coding gains, even at high data rates, without increasing the speed of decoding elements in pipelined datapaths.

In view of the above detailed description of the present invention and associated drawings, other modifications and variations will now become apparent to those skilled in the art. It should also be apparent that such other modifications and variations may be effected without departing from the spirit and scope of the present invention.

We claim:

1. A decoding system for decoding serially concatenated encoded symbols comprising:

a first serial concatenated code decoder comprising a soft input inner decoder, a de-interleaver, and a hard input outer decoder coupled in series, the soft input inner decoder of the first serial concatenated code decoder configured to receive as an input data derived from the serially concatenated encoded symbols, and the hard input outer decoder of the first serial concatenated code decoder configured to output hard bit decisions and corresponding status indicators; and a first replicable unit comprising:

a first interleaver, an inner encoder, and a mapper coupled in series, wherein the first interleaver is configured to interleave data derived from the hard bit decisions, and the mapper is configured to map encoded information from the inner encoder into high-reliability soft values;

a second interleaver and a modified inner encoder coupled in series, wherein the second interleaver is configured to interleave data derived from the status indicators, and the modified inner encoder is configured to produce selection values;

a multiplexor for selecting, responsive to the selection values, between outputting data derived from the serially concatenated encoded symbols as delayed and the high reliability soft values; and a second serial concatenated code decoder comprising a soft input inner decoder, a de-interleaver, and a hard input outer decoder coupled in series, the soft input inner decoder of the second serial concatenated code decoder configured to receive as an input data derived from the output of the multiplexor, and the hard input outer decoder of the second serial concatenated code decoder configured to output hard bit decisions and corresponding status indicators.

2. The system of claim 1 further comprising a second replicable unit which is a replica of the first replicable unit and has first and second interleavers, wherein the first interleaver of the second replicable unit is configured to interleave data derived from the hard bit decisions produced within the first replicable unit, and the second interleaver of the second replicable unit is configured to interleave data derived from the status indicators produced within the first replicable unit.

3. The system of claim 2 wherein the first and second replicable units are pipelined replicas of one another.

4. The system of claim 2 wherein the first and second replicable units are instantiations of a unit shared over different iterations.

5. The system of claim 2 wherein the first and second serial concatenated code decoders are instantiations of a decoder shared over different iterations.

6. The system of claim 1 wherein the soft input inner decoders of the first and second serial concatenated code decoders are Viterbi decoders.

7. The system of claim 1 wherein the hard input outer decoders of the first and second serial concatenated code decoders are block decoders.

8. The system of claim 7 wherein the block decoders are Reed Solomon decoders.

9. The system of claim 1 wherein the inner encoder of the first replicable unit is configured with a plurality of XOR gates, and the modified inner encoder of the first replicable unit is a replica of the inner encoder of the first replicable unit with one or more of the plurality of XOR gates thereof replaced with AND gates.

10. A decoding system for decoding serially concatenated encoded symbols comprising:
a first serial concatenated code decoder comprising a soft input inner decoder, a de-interleaver, and a hard input outer decoder coupled in series, the soft input inner decoder of the first serial concatenated code decoder configured to receive as an input data derived from the serially concatenated encoded symbols, and the hard input outer decoder of the first concatenated code decoder configured to output hard bit decisions and corresponding status indicators; and
a first replicable unit comprising:
a first interleaver configured to interleave data derived from the hard bit decisions;
a second interleaver configured to interleave data derived from the status indicators; and
a second serial concatenated code decoder comprising a soft input inner decoder, a de-interleaver, and a hard input outer decoder coupled in series, the soft input inner decoder of the second serial concatenated code decoder configured to (1) receive as inputs data derived from the interleaved status indicators and interleaved hard bit decisions, and data derived from the serial concatenated encoded symbols as delayed, and (2) selectively render state or branch metrics as undesirable responsive to the data derived from the interleaved status indicators, and the hard input outer decoder of the second serial concatenated code decoder configured to output hard bit decisions and corresponding status indicators.

11. The system of claim 10 further comprising a second replicable unit which is a replica of the first replicable unit and has first and second interleavers, wherein the first interleaver of the second replicable unit is configured to interleave data derived from the hard bit decisions produced within the first replicable unit and the second interleaver of the second replicable unit is configured to interleave data derived from the status indicators produced within the first replicable unit.

12. The system of claim 11 wherein the first and second replicable units are pipelined replicas of one another.

13. The system of claim 11 wherein the first and second replicable units are instantiations of a unit shared over different iterations.

14. The system of claim 10 wherein the soft input inner decoders of the first and second serial concatenated code decoders are Viterbi decoders.

15. The system of claim 10 wherein the hard input outer decoders of the first and second serial concatenated code decoders are block decoders.

16. The system of claim 15 wherein the block decoders are Reed Solomon decoders.

17. The system of claim 10 wherein the first and second serial concatenated code decoders are instantiations of a decoder shared over different iterations.

18. A decoding system for decoding serially concatenated encoded symbols comprising:
first serial concatenated code decoding means for receiving as an input data derived from the serially concatenated encoded symbols, and outputting bard bit decisions and corresponding status indicators; and
a first replicable unit comprising:
first interleaving means for interleaving data derived from the hard bit decisions;
second interleaving means for interleaving data derived from the status indicators; and
second serial concatenated code decoding means for outputting hard bit decisions and corresponding us indicators responsive to the interleaved data from the first and second interleaving means.

19. The system of claim 18 wherein the first replicable unit further comprises:
inner encoding means for encoding data derived from the interleaved data provided by the first interleaving means and mapping means for mapping data derived from the encoded data provided by the inner encoding means into high reliability soft values;
modified inner encoding means for producing selection values responsive to the interleaved data from the second interleaving means; and
multiplexing means for selecting, responsive to the selection values, between outputting data derived from the serially concatenated encoded symbols as delayed and the high reliability soft values;
wherein the second serial concatenated code decoding means outputs hard bit decisions and corresponding status indicators responsive to data derived from the output of the multiplexing means.

20. The system of claim 19 wherein the inner decoding means is configured with a plurality of XOR gates, and the modified inner encoding means of the first replicable unit comprises the inner encoding means of the first replicable unit with one or more of the XOR gates thereof replaced with AND gates.

21. The system of claim 18 wherein the second serial concatenated code decoding means selectively renders state or branch metrics as undesirable responsive to the interleaved data from the second interleaving means, and also outputs hard bit decisions and corresponding status indicators responsive to the interleaved data from the first interleaving means and,data derived from the serial concatenated encoded symbols as delayed.

22. The system of claim 18 further comprising a second replicable unit wherein the first interleaving means thereof interleaves data derived from the hard bit decisions produced within the first replicable unit and the second interleaving means thereof interleaves data derived from the status indicators produced within the first replicable unit.

23. The system of claim 22 wherein the first and second replicable units are pipelined replicas of one another.

24. The system of claim 22 wherein the first and second replicable units are instantiations of the same unit shared over different iterations.

25. The system of claim 18 wherein the first and second serial concatenated code decoding means are instantiations of the same decoding means shared over different iterations.

26. A method of decoding serially concatenated encoded symbols comprising:
outputting hard bit decisions and corresponding status indicators responsive to data derived from the serially concatenated encoded symbols; and
performing the following substeps in a first replicable unit:
interleaving data derived from the hard bit decisions;
interleaving data derived from the status indicators; and
outputting hard bit decisions and corresponding status indicators responsive to data derived from the interleaved status indicators, the interleaved hard bit decisions, and the serial concatenated encoded symbols as delayed.

27. The method of claim 26 further comprising performing the following substeps in the first replicable unit:

encoding data derived from the interleaved hard bit decisions;

mapping the encoded data into high reliability soft values;

encoding data derived from the interleaved status indicators to produce selection values;

selecting, responsive to the selection values, between outputting data derived from the serially concatenated encoded symbols as delayed and the high reliability values; and outputting hard bit decisions and corresponding status indicators responsive to the selected data.

28. The method of claim 26 further comprising performing the following substeps in the first replicable unit:

selectively rendering state or branch metrics in a soft input inner decoder as undesirable responsive to the interleaved status indicators; and outputting from the soft input inner decoder hard bit decisions and corresponding status indicators responsive to the interleaved hard bit decisions and the serial concatenated encoded symbols as delayed.

29. The method of claim 26 further comprising performing the following substeps in a second replicable unit:

interleaving data derived from the hard bit decisions produced within the first replicable unit;

interleaving data derived from the status indicators produced within the first replicable unit; and outputting hard bit decisions and corresponding status indicators responsive to data derived from the interleaved status indicators and the interleaved hard bit decisions as produced within the first replicable unit, and the serial concatenated encoded symbols as delayed.

30. The method of claim 29 wherein the first and second replicable units are pipelined replicas of one another.

31. The method of claim 29 wherein the first and second replicable units are instantiations of the same unit shared over different iterations.

* * * * *